United States Patent [19]

Huemmer et al.

[11] Patent Number: 4,925,769
[45] Date of Patent: May 15, 1990

[54] LIGHT-SENSITIVE PHOTOPOLYMERIZABLE LAMINATE MATERIAL

[75] Inventors: Wolfgang Huemmer, Limburgerhof; Bernd Bronstert, Otterstadt; Dieter Littmann, Hessheim; Manfred Zuerger, Sinsheim, all of Fed. Rep. of Germany

[73] Assignee: BASF Aktiengesellschaft, Ludwigshafen, Fed. Rep. of Germany

[21] Appl. No.: 324,709

[22] Filed: Mar. 17, 1989

[30] Foreign Application Priority Data

Mar. 17, 1988 [DE] Fed. Rep. of Germany ....... 3808952

[51] Int. Cl.$^5$ ................................................. G03C 1/76
[52] U.S. Cl. ..................................... 430/271; 430/327; 430/394
[58] Field of Search ................... 430/271 A, 271, 327, 430/273, 394

[56] References Cited

U.S. PATENT DOCUMENTS

| | | |
|---|---|---|
| 4,355,093 | 10/1982 | Hartmann et al. ............. 430/273 X |
| 4,539,286 | 9/1985 | Lipson et al. . |
| 4,610,951 | 9/1985 | Lipson et al. . |
| 4,650,743 | 3/1987 | Galloway ..................... 430/273 X |
| 4,698,294 | 10/1987 | Lau et al. ........................ 430/327 X |

FOREIGN PATENT DOCUMENTS

| | | |
|---|---|---|
| 567530 | 7/1984 | Australia . |
| 0128014 | 2/1979 | European Pat. Off. . |
| 0036301 | 9/1981 | European Pat. Off. . |
| 1447029 | 5/1982 | European Pat. Off. . |
| 1044385 | 4/1981 | United Kingdom . |

OTHER PUBLICATIONS

Fikentscher, *Cellulose Chem.*, 13 (1932), 58, 44.
Fikentscher, *Cellulosechemie*, 13 (1932), 58.

Primary Examiner—Paul R. Michl
Assistant Examiner—Cynthia Hamilton
Attorney, Agent, or Firm—Keil & Weinkauf

[57] ABSTRACT

Photopolymerizable laminates suitable for producing printing plates have on a dimensionally stable base at least one intermediate layer and on top thereof a photopolymerizable relief-forming layer, the intermediate layer containing aryl glycidyl (meth)acrylate in an at least partially polymerized state.

10 Claims, No Drawings

LIGHT-SENSITIVE PHOTOPOLYMERIZABLE LAMINATE MATERIAL

The present invention relates to a light-sensitive photopolymerizable laminate material suitable for producing printing plates which on a dimensionally stable base carries at least one intermediate layer and on top thereof a relief-forming light-sensitive photopolymerizable layer which consists essentially of a mixture of polymeric binder, at least one ethylenically unsaturated polymerizable compound, photoinitiator and an inhibitor against thermal polymerization, and to a process for producing such light-sensitive laminate materials.

Light-sensitive laminate materials which have specific adhesion-promoting layers between base layer and relief-forming light-sensitive layer are already known. For instance, DE-A-No. 2,202,357 discloses firmly attaching photopolymeric relief layers for printing plates to the base layers by means of specific adhesion-promoting coatings, the coating of the bases, for example the steel or aluminum sheets, with a base coat (BC) for improved adhesion to the relief-forming light-sensitive layer being followed by the application of an adhesion-promoting layer APL by layered application and drying or baking of a lacquer (OL) which contains a curable mixture of a binder which is compatible with the polymeric binder of the relief-forming layer. However, the baking/curing of the adhesion-promoting layers APL requires the use of high temperatures, which on the one hand requires high energy resources with appropriately high manufacturing costs and on the other does not permit the use of some base materials, since they do not survive the heat treatment without severe impairment of their properties. This is true for example for the production of photopolymeric printing plates with polyester sheets as base layers. Although it is known that the curing temperature of curable formaldehyde resins can be reduced by the addition of acids as catalysts, such catalyzed resins, owing to their short pot life, are not suitable for the production of uniform coatings and thin adhesion-promoting layers.

DE-A-No. 3,045,515 discloses a light-sensitive laminate material which, between a base layer (B) with or without a base coat (BC) and a light-sensitive layer (R) comprising a photoinitiator-containing mixture of at least one binder and at least one ethylenically unsaturated compound compatible therewith, contains adjacent to the light-sensitive layer R an adhesion-promoting layer APL comprising a cured mixture of from 65 to 98% by weight of a binder (A1) compatible with the binder of the layer R and the condensate (AZ) and from 2 to 35% by weight of a melamine-formaldehyde condensate which is curable at from 60° to 120° C. without acid catalysis and contains from 1 to 5 melamine units having a degree of methylolation of from 40 to 100%, with from 10 to 60% of the methylol groups having been etherified with alcohol.

EP-A-No. 0,036,301 discloses a light-sensitive polyamide resin mixture of alcohol-soluble polyamide, a nonpolymeric compound which has not only vinyl but also epoxy groups in one and the same molecule and is capable of reaction with the polymeric binder to form copolymerization-capable polymers, and a polyfunctional vinyl monomer having

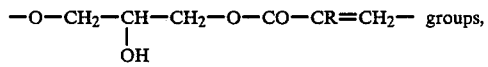

including phenyl glycidyl ether acrylate as a plasticizing component, combined with polyfunctional acrylates, in photopolymerizable printing plates which contain alcohol-soluble modified polyamide as polymeric binder. In this prior art, a plasticizing component is also used in the relief layer.

It is an object of the present invention to specify light-sensitive photopolymerizable laminate materials which not only show improved adhesion of the relief layer to the base material but also a shorter minimum irradiation time in the production of printing plates from these laminate materials.

We have found, surprisingly, that this object is achieved in a very advantageous manner by using intermediate layers which contain or consist of certain aryl glycidyl ether (meth)acrylates in an at least partially polymerized state.

The present invention thus provides a light-sensitive photopolymerizable laminate material suitable for producing printing plates which on a dimensionally stable base carries at least one intermediate layer and on top thereof a relief-forming light-sensitive layer which consists essentially of a mixture of polymeric binder, at least one ethylenically unsaturated polymerizable compound, photoinitiator and thermal polymerization inhibitor, wherein at least one intermediate layer contains a compound of the general formula (I)

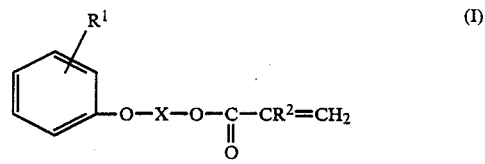

where
$R^1$ is hydrogen or alkyl of from 1 to 10 carbon atoms,
$R^2$ is hydrogen or methyl, and X is

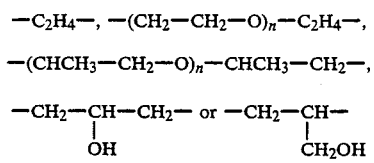

where n is from 1 to 8, in an at least partially polymerized state.

In the laminate material according to the invention, there may be present on the dimensionally stable base as a first intermediate layer a thin layer of a customary adhesion promoter and on top thereof a second intermediate layer which contains a compound of the general formula (I) mixed with a polymeric binder in an at least partially polymerized state, or an intermediate layer may consist of a compound of the general formula (I) in an at least partially polymerized state.

In an advantageous refinement of the invention, at least one intermediate layer consists of a mixture of a compound of the general formula (I) with a polymeric binder compatible therewith, in which the compound of the general formula (I) is present in an at least partially polymerized state and the polymeric binder used is in particular polyvinyl alcohol, a derivative of polyvinyl alcohol, a polyamide or an ethylene/(meth)acrylic ester/(meth)acrylic acid copolymer.

The light-sensitive layer of the laminate material according to the invention may be covered in a conventional manner with a cover sheet removable by peeling.

The present invention also provides a process for producing a light-sensitive photopolymerizable laminate material, which comprises applying a solution which contains a compound of the general formula (I) as an intermediate layer to the dimensionally stable base, substantially removing the solvent, applying the relief-forming light-sensitive layer and then subjecting the layered structure obtained to uniform exposure until the intermediate layer is substantially fully cured without polymerizing the ethylenically unsaturated polymerizable compounds present in the relief-forming layer to any significant extent.

The light-sensitive photopolymerizable laminate materials according to the invention, i.e. the product of the process according to the invention, are notable for improved adhesion, substantially improved resistance to developer, and a longer press life.

There now follow specifics concerning the structural components of the laminates according to the invention and of the materials to be used for the process according to the invention.

Suitable compounds of the general formula (I)

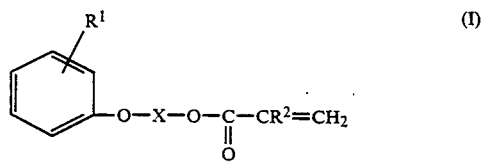

are those where $R^1$ is hydrogen, alkyl of from 1 to 10 carbon atoms or aryl of from 6 to 10 carbon atoms, $R^2$ is hydrogen or methyl,
and X is $$-C_2H_4-, -(CH_2-CH_2-O)_n-C_2H_4-,$$
$$-(CHCH_3-CH_2-O)_n-CHCH_3-CH_2-,$$

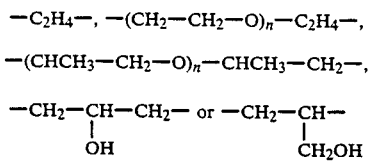

where n is from 1 to 8.

Suitable $R^1$, besides hydrogen, is for example alkyl of from 1 to 10 carbon atoms, e.g. methyl, ethyl, n-propyl, isopropyl, n-butyl, isobutyl, tert-butyl, hexyl, n-octyl or isooctyl, or aryl, e.g. phenyl or naphthyl.

Preference is given to those compounds of the formula (I) where $R^1$ is hydrogen or methyl and X is

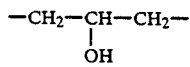

Suitable dimensionally stable bases are those customarily used for the production of photopolymeric printing plates, for example steel sheets, aluminum sheets and plastics sheets, for example those made of polyesters, such as polyethylene terephthalate, polycarbonate, polyvinyl chloride or polyamide.

It can be advantageous to coat the dimensionally stable base initially with an adhesive base coat. Suitable for this purpose are various base coating materials, provided they ensure adequate adhesion between base material and intermediate and/or adhesion-promoting layers to be applied thereto and, if necessary, are driable or bakeable at temperatures at which the properties of the base material are not thermally damaged.

Of high suitability are usually pigmented and unpigmented base coats prepared from reactive lacquers which contain polyisocyanates and hydroxyl-containing oligomers and polymers such as hydroxyl-containing epoxy resins and/or hydroxyl-containing polyesters (preferably with molecular weights of from 20000 to 30000) or mixtures thereof with other polyols, for example 1,4-butanediol. To prepare the base coat, for example the ready-mixed base coating having a solids content of 20–70% by weight is applied to the dimensionally stable base in such a thickness as to produce a dry film thickness of 3–100 μm, preferably 5–20 μm. The coating can be effected by means of one of the customary techniques such as brushing, spraying, dipping, casting or roller application. Thereafter the coating can be dried or baked, depending on the base material, at from 50° to 300° C.

To produce the intermediate or adhesion-promoting layer on the dimensionally stable base or on the base-coated dimensionally stable base, a compound of the general formula (I) or a mixture thereof with a polymeric binder compatible therewith with or without further additives is applied, advantageously in the form of a solution, in such layer thicknesses as to give a dry film thickness of 3–25 μm, in particular 5–15 μm. This coating can likewise be effected by brushing, spraying, dipping, casting or roller application.

Possible polymeric binders which may be used mixed with a compound of the general formula (I) are: water-soluble copolymers or derivatives of polyvinyl alcohol, for example elastomeric graft polymers soluble or dispersible in aqueous solvents and obtained by polymerization of vinyl esters in the presence of polyalkylene oxides and a free radical polymerization initiator, hydrolysis or partial hydrolysis of the resulting graft copolymer and subsequent esterification or transesterification, as the case may be, of vinyl alcohol units on the hydrolyzed or partially hydrolyzed graft copolymer and which consist essentially of structural units of the composition

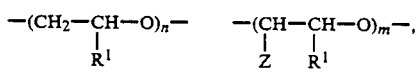

where

Z is a grafted-on side branch having structural units

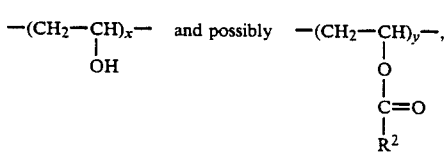

$R^1$ is hydrogen or alkyl of 1 or 2 carbon atoms,
$R^2$ is alkyl or alkenyl with or without carboxyl substituents,
and $x > y$, $n > m$, m is at least 2, $n + m = 20-2{,}000$ and $$\frac{(n+m)}{(x+y)} = \frac{1}{4} \text{ to } \frac{3}{1}$$

as described in EP-A-No. 224,164.

Similar suitability is possessed by polyvinyl alcohols of the type described in EP-A-No. 220,507 or DE-A-No. 3,322,993 which are partially esterified with methacrylic acid, and by partially acetalated polyvinyl alcohol. Such suitable polyvinyl alcohols in general have molecular weights $\overline{M}_n$ of from about 4000 to 100000, preferably of from 10000 to 70000, polyamides, for example copolyamides as described in DE-A-No. 1,522,463, for example copolyamides of approximately equal parts of hexamethylenediammonium adipate, 4,4'-diammoniumdicyclohexylmethane adipate and ε-caprolactam, having K values (according to Fikentscher, Cellulosechemie 13, (1932), 58) of from 55 to 75, carboxyl-containing copolymers, in particular those acrylate resins, for example, based on copolymers of (meth)acrylic esters with (meth)acrylic acid, which have acid numbers of from 30 to 100, molecular weights ($\overline{M}_w$) of from about 10000 to about 100000 and glass transition temperatures of from 30° to 80° C., for example commercial products such as Carboset ® resin XL 44 from BF Goodrich, and also ethylene/(meth)acrylic ester/(meth)acrylic acid copolymers, for example those having MFI (melt flow index) values measured at 190° C. under a load of 2.16 kg in g/10 minutes of from 50 to 400 and acid numbers of from 50 to 200 mg KOH/g.

The polymeric binders may in general be present in the intermediate layers in amounts of from 0 to 90, preferably of from 35 to 80 %, by weight, based on the total weight of the solvent-free intermediate layer.

Further possible constituents for producing the intermediate or adhesion-promoting layers are photoinitiators or photoinitiator systems, thermal polymerization inhibitors, solvents, aqueous or organic solvent mixtures, and additives for producing particular effects, for example glyoxal or glutardialdehyde.

Photoinitiators are in general present in amounts of from 0.01 to 10, in particular of from 0.01 to 3%, by weight, based on the total amount of intermediate layer, suitable photoinitiators being those compounds which on exposure to actinic light are capable of forming free radicals and initiate rapid photopolymerization in the layer. Examples of possible photoinitiators are acyloins and acyloin ethers, aromatic diketones and derivatives thereof and polycyclic quinones. High suitability is possessed by benzoin and α-hydroxymethylbenzoin and in particular their alkyl ethers of from 1 to 8 carbon atoms, such as benzoin isopropyl ether, α-hydroxymethylbenzoin methyl ether, or benzoin methyl ether, benzil monoketals such as benzil dimethyl ketal, benzil methyl ethyl ketal, benzil methyl benzyl ketal, or benzil neopentyl ketal, and diarylphosphine oxides as described in DE-A-No. 2,909,992, preferably 2,6-dimethoxybenzoyldiphenylphosphine oxide and in particular 2,4,6-trimethylbenzoyldiphenylphosphine oxide. Preference is given to such types and amounts of photoinitiators that initiation of the photopolymerization on imagewise exposure to actinic light, in particular UV light, takes only short minimum irradiation times, preferably not more than a few minutes.

The photopolymerizable intermediate layers according to the invention advantageously also contain in addition thermal polymerization inhibitors, such as hydroquinone, p-methoxyphenol, dinitrobenzene, p-quinone, methylene blue, β-naphthol, N-nitrosamines such as N-nitrosodiphenylamine, phenothiazine, phosphorous esters such as triphenyl phosphite or the salts and in particular the alkali metal and aluminum salts of N-nitrosocyclohexylhydroxylamine. The inhibitors are mixed into the photopolymerizable mixtures of the relief-forming polymerizable layer in general in an amount of from 0.001 to 3% by weight, in particular in an amount of from 0.003 to 1% by weight, based on the total amount of polymerizable layer.

In the usual manner, it is of course also possible to include further customary additives, such as plasticizers, saturated low molecular weight compounds having amide or alcohol groups, waxes, soluble dyes, pigments and the like.

After the intermediate layer has been applied to the dimensionally stable base, which may have been coated with an adhesive base coat, the removal of any solvent present, by evaporation or drying, is in general followed by a uniform exposure of the intermediate layer to actinic light in order to convert the compound of the general formula (I) at least partially, preferably predominantly, into a polymeric state.

Another option, after the intermediate layer has been applied and the solvent removed, is to apply the photopolymerizable relief-forming layer directly to the intermediate layer and then to subject the layered structure obtained to uniform exposure for a sufficiently long time that, although the ethylenically unsaturated polymerizable compounds present in the relief-forming layer do not polymerize to any significant extent, if at all, the intermediate layer is at least partially converted into a polymerized state. Irradiation in the case of transparent bases may also take place from the back.

A further way of converting the intermediate layer into a polymerized state is a thermally initiated polymerization, in which case typical initiators of free-radical polymerization, for example organic peroxides, such as benzoyl peroxide, or labile azo compounds, such as azodiisobutyronitrile, may be present. This process is suitable in particular in the case of metallic base materials which withstand the requisite high temperatures (in general above 100° C.) without loss of dimensional stability.

The relief-forming layer is in general advantageously laminated onto the intermediate or adhesion-promoting layer, the laminating solvent being determined by the polymeric binders in the relief-forming layer. Lamination may also take place without solvent, for example as hot lamination.

Suitable polymeric binders for the light-sensitive relief-forming layer are virtually all polymer binders specified in the literature for the production of photopolymeric printing or relief plates. Suitable ones are polyamides and in particular alcohol-soluble copolyamides of the type described in FR Patent No. 1,520,856, cellulose derivatives, in particular those which can be washed out with aqueous alkali, vinyl alcohol polymers and polymers and copolymers of vinyl esters of aliphatic monocarboxylic acids of from 1 to 4 carbon atoms, as of vinyl acetate, having different degrees of hydrolysis, homopolymers and copolymers of vinylpyrrolidone, polyurethanes, polyether urethanes, polyester urethanes, polyester resins, acrylic and methacrylic ester copolymers such as copolymers of methyl methacrylate with acrylic acid, methacrylic acid, acrylamide and/or hydroxyalkyl (meth)acrylates, and elastomeric diene polymers and copolymers such as block copolymers of butadiene and/or isoprene homopolymer blocks and polymer blocks of styrene or α-methylstyrene, and also ethylene elastomers as described for example in DE-A-No. 3,540,950. They are customarily present in the relief-forming layers mixed with one or more photopolymerizable ethylenically monounsaturated or polyunsaturated compounds compatible therewith, whose identity and amount depend on the identity of the polymer binder and on the type of use intended for the light-sensitive laminate materials.

The mixing ratio in this mixture of monomers and polymeric binder is variable within a wide range: it is preferably from 10 to 55, in particular from 25 to 50% by weight of monomer; from 45 to 90, in particular from 50 to 75% by weight of polymeric binder, based on the total of the amount of monomer and polymeric binder. Preferred relief-forming layers are solid at room temperature and in general are from 200 to 1200 μm in thickness. The level of prior art photoinitiators which on exposure to actinic light are capable of forming free radicals is in general from 0.01 to 15% by weight of the total amount of the relief-forming layer.

Examples of particularly preferred polymeric binders for the relief-forming layer are polyvinyl alcohols having a residual acetate content of from 10 to 30 mol % and an average molecular weight $\overline{M}_w$ of from about 10000 to about 30000, internally plasticized polyvinyl alcohols based on polyethylene oxide/polyvinyl alcohol graft copolymers as already mentioned for the production of the intermediate layer (cf. EP-A No. 224,164), alcohol-soluble copolyamides, for example those from approximately equal parts of hexamethylenediammonium adipate, 4,4'-diammoniumdicyclohexylmethane adipate and ε-caprolactam, polyvinyl alcohols hydrolyzed to 80 mol % and esterified with methacrylic acid on about 3 mol % of the free OH groups (prepared as described for example in DE-A No. 3,322,993), and copolymers, in particular terpolymers or tetrapolymers of ethylene, (meth)acrylic acid and esters of acrylic acid, e.g. n-butyl acrylate (prepared as described for example in DE-A No. 3,540,950).

Examples of olefinically unsaturated photopolymerizable compounds to be used in the relief-forming layer are compounds having at least one photopolymerizable olefinically unsaturated double bond. Here, it is possible to use the known monomers, oligomers and unsaturated polymers used for the production of relief plates and photopolymer letterpress, intaglio and offset printing plates, whose identity depends on the intended purpose of the mixtures and also on the identity of the other mixture components. It is possible to use monomers having two or more olefinically unsaturated photopolymerizable double bonds on their own or mixed with monomers having only one olefinically unsaturated photopolymerizable double bond. It is also possible to use polymers having a plurality of internal or terminal olefinically unsaturated double bonds in place of or mixed with the monomers.

Examples of suitable monomers are di- and polyacrylates and di- and polymethacrylates as are preparable by esterifying diols or polyols with acrylic acid or methacrylic acid, such as di- and tri(meth)acrylates of ethylene glycol, diethylene glycol, triethylene glycol or polyethylene glycols having a molecular weight of up to about 500, 1,2-propanediol, 1,3-propanediol, neopentylglycol (2.2-dimethylpropanediol), 1,4-butanediol, 1,1,1-trimethylolpropane, glycerol or pentaerythritol, and also the monoacrylates and monomethacrylates of such diols and polyols, for example mono-, di-, tri- or tetraethylene glycol monoacrylate, monomers having two or more olefinically unsaturated bonds which contain urethane groups and/or amide groups, such as those low molecular weight compounds prepared from aliphatic diols of the aforementioned type, organic diisocyanates and hydroxyalkyl (meth)acrylates. It is also possible to use acrylic acid, methacrylic acid and derivatives thereof such as (meth)acrylamide, N-hydroxymethyl(meth)acrylamide or the (meth)acrylates of monoalcohols of from 1 to 6 carbon atoms.

Suitable monomers also include reaction products of glycidyl ethers with acrylic acid or methacrylic acid, for example reaction products of bisphenol A diglycidyl ether or butanediol diglycidyl ether with acrylic acid or methacrylic acid.

Suitable photoinitiators and thermal polymerization inhibitors for the relief-forming layer are those already mentioned for the production of the intermediate layer, the applicable quantities here being likewise roughly the same (i.e. from 0.01 to 10, preferably from 0.01 to 3% by weight of photoinitiator and from 0.001 to 3, preferably from 0.003 to 1% by weight of inhibitor, each based on the total amount of polymerizable layer).

Possible plasticizers for inclusion in the relief-forming layer are those of the customary type, for example benzenesulfonamide, benzene-N-n-butylsulfonamide, or polyhydric alcohols, such as glycerol or OH-containing polyethers, amino alcohols, for example triethanolamine, or commercial phthalic esters, which may be used in amounts of from 0 to 30% by weight, based on the dry weight of the relief-forming layer.

The photopolymerizable relief-forming layer may also contain a regulant system as described for example in EP-A No. 114,341.

Regulant systems are mixtures of certain dyes (1) with mild reducing agents (2) for the dye (1) (cf. also EP-A No. 0,114,341). The mixture of (1) +(2) on imagewise exposure to actinic light should not initiate any significant photopolymerization in the layer of the photopolymerizable mixture, which is ascertainable with a few experiments. If for example the irradiation time for novel, preferably essentially solvent-free, layers of the photopolymerizable, photoinitiator-containing mixture X is of the order of hours or minutes, then the same layer without the photoinitiator should advantageously not contain any marked proportions of photopolymerized layer during the subsequent development of the relief plate by washout even if the irradiation time employed is ten times as long; in general, less than 20% by weight of the irradiated monomer should have been photopolymerized.

Suitable dyes (1) for the photopolymerizable mixtures of the relief-forming layer are in particular those of the series of the phenoxazine dyes, for example:

Capri Blue GN (C.I. 51000), Zapon Fast Blue 3 G (C.I. 51005), Gallo Blue E (C.I. 51040), Fast New Blue 3 R (C.I. 51175), Nile Blue A (C.I. 51180), Fast Green M (C.I. 51210), Fast Black L (C.I. 51215) and also rhodanil blue, the salt or amide of Rhodamine B (Basic Violet 10, C.I. 45170) and nile blue (Basic Blue 12, C.I. 51180), compounds of the series of the phenazinium dyes, e.g. neutral red (C.I. 50040), neutral violet (C.I. 50030), Azine Scarlet G (C.I. 50045), Rhoduline Heliotrope 3 B (C.I. 50055), Neutral Blue C (C.I. 50150), Azine Green GB (C.I. 50155), Safranine B (C.I. 50200), Indamine Blue B (C.I. 50204), Rhoduline Red G (C.I. 50215), Rhoduline Blue GG Extra (C.I. 50220), Indazine GB (C.I. 50221), Safranine T (C.I. 50240), mauveine (C.I. 50245), naphthyl red (C.I. 50370) and also Nigrosine Black T (C.I. 50415), acridinium dyes, e.g. acriflavine (C.I. 46000), Acridine Orange (C.I. 46005), Acridine Scarlet J (C.I. 46015), Acridine Yellow G (C.I. 46025), Aurazine G (C.I. 46030), Crystal Phosphine GG IC.I. 46035), Phosphine E (C.I. 46045), flaveosin (C.I. 46060), Benzoflavine (C.I. 46065) and Rheonine A (C.I. 46075) and also phenothiazinium dyes, e.g. Methylene Blue or Thionine. It is also possible to use (isobutylthio)anthraquinone as dye (1).

The choice of dye (1) used in the photopolymerizable mixture is chiefly determined by esthetics. For instance, visual inspection of the printing plates is particularly simple with the compounds Neutral Red (C.I. 50040), Safranine T (C.I. 50240) and also Rhodanil Blue, which are preferably used in the photopolymerizable mixture.

The light-sensitive relief-forming layers may thus contain combined with dye (1) an amount of a reducing agent (2) sufficient for the dye (1), which does not reduce the dye (1) in the absence of actinic light but on irradiation is capable of reducing the dye in the excited state, in particular to the semiquinone. Examples of such mild reducing agents are ascorbic acid, anethole, thiourea, diethylallylthiourea, hydroxylamine derivatives, in particular N-allylthiourea and preferably salts of N-nitrosocyclohexylhydroxylamine, in particular the potassium and aluminum salts. The latter are also known for use as inhibitors of thermal polymerization in photopolymerizable mixtures. The amount of reducing agent added is in general from about 0.005 to 5, and in particular from 0.01 to 1% by weight, based on the total amount of photopolymerizable layer, but should not be less than the reduction equivalent of the amount of dye (1) used. In many cases, the addition of from 3 to 10 times the amount of dye (1) used has proven useful.

The photopolymerizable laminate materials are in general produced by applying a homogeneous mixture of the components of the photopolymerizable relief layer, with or without the addition of solvents or solvent mixtures, to the dimensionally stable base coated with at least one adhesion-promoting (=intermediate) layer.

The homogeneous photopolymerizable mixture of the relief-forming layer is preparable in a conventional manner by mixing the individual components in customary mixing apparatus, for example in kneaders, extruders or stirred kettles. The homogeneous mixture is then in general applied in a thickness of from 25 to 6000, preferably of from 200 to 1000, μm to the dimensionally stable base coated with the adhesion-promoting layer or with one or more intermediate layers.

It can also be advantageous to employ on top of the photopolymerizable relief-forming layer a top or protective layer, for example a thin layer of polymer which is soluble in the developer medium, for example polyvinyl alcohol or polyvinyl alcohol/polyethylene oxide copolymer.

The photopolymerizable laminate materials according to the invention are processable into relief plates, in particular printing plates, in a conventional manner. To this end, the layer of photosensitive material is in general subjected to imagewise exposure under actinic light from light sources such as UV fluorescent tubes, high, medium or low pressure mercury lamps, fluorescent tubes and the like, where the emitted wavelength is preferably within the range from 300 to 420 nm. The unexposed and uncrosslinked transfer layer may be removed by spraying, washing, brushing and the like with aqueous solvents or water. It is an advantage of the laminate materials according to the invention that they permit washout of the unexposed parts of the layer with pure water without the addition of organic solvents. Advantageously, developed relief and printing plates are dried at up to 120° C. and, if desired, afterexposed to actinic light at the same time or thereafter.

The printing plates produced from the recording materials according to the invention are suitable in particular for direct and indirect letterpress printing, for example for flexographic printing, newsprint flexographic printing and similar printing processes.

The laminate materials according to the invention which contain in the intermediate or adhesion-promoting layer a compound of the general formula (I), in particular phenyl glycidyl ether (meth)acrylate, as a photopolymerizable ethylenically unsaturated compound are very advantageous to manufacture and to process into printing plates which show significantly improved adhesion of the relief layer to the base material and a distinctly shortened minimum irradiation time in the production of printing plates.

The invention is illustrated by the Examples below. Parts and percentages are by weight, unless otherwise stated. Parts by volume bear the same relation to parts by weight as the liter to the kilogram.

EXAMPLE 1

(a) Production of relief-forming layer:

50 parts of an internally plasticized polyvinyl alcohol based on a polyethylene oxide/polyvinyl alcohol graft copolymer (viscosity of 4% strength solution in water at 25° C. 4 mPas; for example Mowiol 04-M1 from Hoechst AG), 50 parts of phenyl glycidyl ether acrylate, 1.2 parts of benzil dimethyl ketal, 0.5 part of the potassium salt of N-nitrosocyclohexylhydroxylamine and 0.05 part of Safranine T (C.I. 50240) are dissolved in 50 parts of water and 50 parts of methanol at 60° C. by stirring. The solution thus obtained is cast onto a polyester sheet and smoothed down in such a way that one hour of drying at not more than 100° C. leaves a layer 0.5 mm in thickness.

(b) Preparation of intermediate or adhesion-promoting layer:

A 0.25 mm thick polyester sheet etched with trichloroacetic acid is caster coated with phenyl glycidyl ether acrylate containing 0.5% of the potassium salt of N-nitrosocyclohexylhydroxylamine and 2% of benzil dimethyl ketal in solution in such a way that smoothing down and 2 minutes' exposure to UV fluorescent tubes (or actinic light) under nitrogen leave a layer 0.02 mm in thickness which has a nontacky surface.

The relief-forming layer obtained under (a) is laminated using a 1:1 mixture of ethanol and water with the base thus prepared, and the resulting ready-to-use plate is stored for some days.

After the cover sheet has been peeled off, the laminate is treated in a conventional manner to produce a plate showing very good adhesion of the relief parts to the base. The adhesion is not measurable in a conventional manner, since the photopolymeric relief layer breaks before the adhesion limit is reached.

EXAMPLE 2

(a) Preparation of relief-forming layer:

50 parts of a commercial alcohol-soluble copolyamide of about equal parts of hexamethylenediammonium adipate, 4,4'-diammoniumdicyclohexylmethane adipate and ε-caprolactam having a K value (according to Fikentscher) of 68 (for example ®Ultramid 1C from BASF AG) are dissolved together with 25 parts of phenyl glycidyl ether acrylate, 25 parts of trimethylolpropane triacrylate, 0.3 part of the potassium salt of N-nitrosocyclohexylhydroxylamine and 2 parts of benzil dimethyl ketal in 90 parts of methanol and 10 parts of water, and the solution is processed into a photopolymerizable relief layer as described in Example 1.

(b) Preparation of intermediate or adhesion-promoting layer:

A 0.25 mm thick polyester sheet etched with trichloroacetic acid is coated with phenyl glycidyl ether acrylate containing 5% of a partially acetalated polyvinyl alcohol (containing about 20% by weight of vinyl alcohol, about 1% by weight of vinyl acetate units and 80 % by weight of vinyl butyral units; K value (according to Fikentscher, Cellulose Chem. 13 (1932), 58) 44), 0.5% of potassium salt of nitrosocyclohexylhydroxylamine and 2% of benzil dimethyl ketal in solution by casting, the cast layer is preirradiated with actinic light for 1 minute, laminated with a 0.05 mm thick polyethylene sheet and fully cured by 2 minutes' irradiation with actinic light.

This layer, which when the polyethylene sheet has been peeled off is found to be nontacky, is laminated using a 1:1 mixture of ethanol and water with the relief layer, and the ready-to-use plate obtained is stored for some days.

The printing plate obtained therefrom in a conventional manner by peeling off the cover sheet is notable for the excellent adhesion of the relief layer to the base. On trying to detach the relief layer from the base sheet, the polyester sheet splits open.

EXAMPLE 3

Aluminum sheets 1.05 mm in thickness and steel sheets 0.24 mm in thickness were each coated with two layers of the adhesive-forming components described hereinafter in order to bond the relief layers of photopolymerizable letterpress plates to the metal sheets by means of polyamide and polyvinyl alcohol binders. 3.1 Preparation of adhesive base coat:

243 parts of a commercial epoxy resin (prepared from bisphenol A and epichlorohydrin) having an epoxy equivalent weight of about 0.02 (based on 100 g of resin), a molecular weight of about 5500 and an OH content of 5.9%, 150 parts of finely divided rutile, 6 parts of finely divided chromium oxide green, 90 parts of talc and 20 parts of a commercial paste of a bentonite modified with organic ammonium bases (for example Bentone ® from National Lead Co.) are ball-milled with a 1:1:1 mixture of butyl acetate, ethylglycol acetate and xylene for 2 days.

The resulting coating solution is admixed with 346 parts of a commercial reaction product of 1 mole of 1,1,1-trimethylolpropane and 3 moles of toluylene diisocyanate as polyisocyanate in the form of a 75% strength solution in 1:1 xylene/ethylglycol acetate.

The resulting base-coating solution is cast onto the aluminum or steel sheet in the form of a layer. The cast coat is flashed off at room temperature for one hour and then baked at 180° C. in a through-circulation cabinet for 5 minutes. The dry film thickness of the resulting adhesive base coat is about 18 μm.

3.2 Preparation of the second adhesion-promoting or intermediate layer:

150 parts of a copolyamide of about equal parts of hexamethylenediammonium adipate, 4,4'-diammoniumdicyclohexylmethane adipate and ε-caprolactam having a K value (according to Fikentscher, Cellulosechemie 13 (1932), 58) of 67, 100 parts of phenyl glycidyl ether acrylate and 5 parts of 2,4,6-trimethylbenzoyldiphenylphosphine oxide are introduced into 9:1 methanol/water at 60° C. with stirring. This gives a 10% strength solution which using a coater is applied to the base-coated metal sheets in such a way as to give a dry film thickness for the intermediate layer of about 0.005 mm. A 30-minute flashoff at room temperature is followed by baking at 50° C. in a continuous nozzle dryer for 1.5 minutes. 3.3 Application of the light-sensitive relief-forming layer:

A 65% strength solution of a mixture of 60% of the copolyamide described under 3.2, 25% of the diether of 1 mole of ethylene glycol and 2 moles of N-hydroxymethylacrylamide, 13.5% of benzenesulfonamide and 1.5% of benzoin tetrahydropyranyl ether is admixed with 0.3% of potassium salt of N-nitrosocyclohexylhydroxylamine, 0.01% of black dye (Colour Index No. 12195) and 0.03% of 2- butylthio-2-anthraquinone. The solution is cast in layer form onto the aluminum sheet coated with adhesive as described in 3.1 and 3.2 in such a way that drying at about 70° C. leaves a light-sensitive relief-forming layer 200 μm in thickness.

3.4 Testing of photopolymerizable laminates

The laminates produced as described in Examples 3.1 to 3.3 are each exposed for from 1, 2, 3 ... to 10 minutes in close contact with a film negative of a 3% halftone value having a halftone line width of 30 lines per centimeter. The exposure unit used is a commercial printing plate exposure unit with superactinic UV fluorescent tubes as light source. The quantity determined is the irradiation time sufficient to give a flawless reproduction of the halftone fields for a washout time extended by a factor of 2 (100% overwash). This minimum irradiation time with overwash decreases for a given relief layer formulation as the suitability of the adhesive-forming system increases.

The laminates produced as described in 3.3 require not only on aluminum sheets but also on steel sheets a minimum irradiation time of 3.0 minutes. The printing plate was washed out at 30° C. in an ethanol/water mixture (87% of ethanol and 13% of water) in a commercial spray washer under a spray pressure of 4 bar for 6 minutes, which amounts to overwashing, although the minimum washout time required is only 3.0 minutes.

EXAMPLE 4

Example 3 is repeated, except that the intermediate layer (see 3.2) does not contain any photoinitiator. The test described in 3.4 gives a slightly inferior minimum irradiation time of 3.75 minutes.

COMPARISON 1a

Example 3 is repeated, except that the intermediate layer contains no phenyl glycidyl ether acrylate and no photoinitiator. The test of the laminates reveals a very poor minimum irradiation time of longer than 10 minutes.

COMPARISON 1b

Example 3 is repeated, except that the intermediate layer contains in place of 100 parts of phenyl glycidyl ether acrylate 65 parts of a curable phenolic resin (prepared by condensation on 30 parts of phenol and 7.5 parts of bisphenol A with excess formaldehyde at 100° C. in the presence of dimethylethanolamine). The coat is baked at 180° C. for 5 minutes. On testing, the laminates are found to have a still inadequate minimum irradiation time of 8 minutes.

EXAMPLE 5

5.1 Preparation of a two-layered adhesive coat

The adhesive base coat is prepared as described in Example 3.1. To prepare the second adhesion-promoting coat (=intermediate layer), Example 3 is not repeated in that 100 parts of an 80 mol % hydrolyzed and 3 mol % methacrylated polyvinyl alcohol (preparation see DE-A No. 3,322,993) having an average molecular weight $\overline{M}_w$ of 17000, 110 parts of phenyl glycidyl ether acrylate, 5 parts of 2,4,6-trimethylbenzoyldiphenylphosphine oxide as photoinitiator and 3 parts of 30% strength aqueous glyoxal solution are dissolved in a 75/25 water/n-propanol mixture at 60° C. with stirring in order to prepare a 14% strength (solids content) coating solution. The thickness and baking conditions are identical to the values described in 3.2.

5.2 Preparation of light-sensitive relief-forming layer:

A 65% strength solution of 60 parts of 80 mol % hydrolyzed and 3 mol % methacrylated polyvinyl alcohol (prepared as described in DE-A No. 3,322,993) having an average molecular weight $\overline{M}_w$ of 17000, 30 parts of diether of 1 mole of ethylene glycol and 2 moles of N-hydroxymethylacrylamide, 7 parts of N-n-butylbenzenesulfonamide, 2 parts of benzil dimethyl ketal, 0.03 part of Safranine T (C.I. 50240), 0.03 part of crystal violet (C.I. 42555) and 0.3 part of the potassium salt of N-nitrosocyclohexylhydroxylamine was prepared by dissolving in a 25:75 mixture of n-propanol and water at 60° C. The solution was cast onto the aluminum and steel sheets described in more detail under 5.1 and dried to a residual solvent moisture content of 6% to give photopolymerizable laminates having a relief layer 0.2 mm in thickness.

5.4 Testing of laminates

The test is carried out exactly as described in Example 3.4, except that the washout agent ethanol/water is replaced by tap water at room temperature. The standard washout time is found to be 1.5 minutes. The washout time extended by a factor of 2 is accordingly 3 minutes. This washout time is employed to produce test plates. These plates are assessed on the criteria identical to those described in Example 3.4. The laminates produced as described in Example 5.2 require not only on steel but also on aluminum sheets a minimum irradiation time of 2.0 minutes. The printing plate was washed out in a spray washer under a spray pressure of 4.5 bar under room temperature for 3 minutes (=twice the standard washout time). Even under these unfavorable conditions, the minimum irradiation time is 2.0 minutes. Even tripling the washout time to 4.5 minutes does not lead to any deterioration in the minimum irradiation time. If the phenyl glycidyl ether acrylate in the adhesion-promoting layer is replaced by a corresponding amount of cresyl glycidyl ether acrylate, again a minimum irradiation time of 2.0 minutes is obtained.

COMPARISON 3a

Example 5 is repeated, except that the adhesion-promoting layer (=intermediate layer) contains no phenyl glycidyl ether acrylate and no photoinitiator. On testing, the laminates are found to have a very poor minimum irradiation time of longer than 10 minutes.

EXAMPLE 6

Printing plate bases made of metal are prepared as described under Example 5.1 to 5.2. However, the thickness of the intermediate layer is not 0.005 mm but 0.03 mm. So as not to polymerize this adhesion-promoting layer thermally, it is dried not at 150° C. in a nozzle drier but in a through-circulation cabinet in the course of 5 minutes. The crosslinking of this adhesion-promoting (=intermediate) layer is effected photochemically by irradiation in a continuous tubular exposure unit equipped with superactinic fluorescent tubes as UV-A light source in the course of a residence time of 60 seconds.

A 65% strength solution of 60 parts of 80 mol % hydrolyzed and 3 mol % methacrylated polyvinyl alcohol (prepared as described in DE-A No. 3,322,993) having an average molecular weight $\overline{M}_w$ of 17000, 30 parts of the diester of 1 mole of 1,4-butanediol diglycidyl ether and 2 moles of acrylic acid, 2 parts of benzil dimethyl ketal, 0.03 part of Safranine T (C.I. 50240) and 0.3 part of the potassium salt of N-nitrosocyclohexylhydroxylamine was prepared by dissolving in a 1:3 n-propanol/water mixture at 60° C. Coating the aluminum or steel sheets described in more detail under 5.1 with this solution and drying to a solvent residual moisture content of 6% gave photopolymerizable laminate materials having a relief layer thickness of 0.7 mm.

These laminate materials require for the standard washout time of 6 minutes at 40° C. under a spray pressure of 4.0 bar a minimum irradiation time of 5.0 minutes, which does not deteriorate markedly even when the washout time is doubled.

COMPARISON 4

Example 6 is repeated, except that the intermediate layer does not contain any phenyl glycidyl ether acrylate. On testing, the laminates are found to require a very poor minimum irradiation time of longer than 10 minutes.

EXAMPLE 7

Metal sheets for use as printing plate base materials are prepared as described under Example 5.1 to 5.2. The thickness of the intermediate layer is not 0.005 mm but 0.01 mm. So as not to polymerize this intermediate layer prematurely by thermal polymerization, it is dried not at 150° C. but at 110° C. in a nozzle drier. The crosslinking of this adhesion-promoting layer is brought about photochemically only during the processing to the printing plate by the step of uniform preexposure.

To produce the laminate, a 65% strength solution of 50 parts of an 80 mol % hydrolyzed polyvinyl alcohol having an average molecular weight $\overline{M}_w$ of 17000, 40 parts of hydroxyethyl methacrylate, 1 part of 1,3,5-trimethylbenzoyldiphenylphosphine oxide and 0.3 part of hydroquinone monomethyl ether is prepared by dissolving in ⅓ n-propanol/water at 60° C. Coating the aluminum and steel sheets described in more detail under 5.1 with this solution and drying to a solvent residual moisture content of 6% gave photopolymerizable laminates having a relief layer-thickness of 0.5 mm.

These laminates require for a standard washout time of 2.5 minutes at 40° C. under a spray pressure of 4.0 bar and a uniform preexposure of 3.5 seconds a minimum main irradiation time of 1.5 minutes, which does not noticeably deteriorate even when the washout time is doubled.

COMPARISON 5

Example 7 is repeated, except that the intermediate layer contains no phenyl glycidyl ether acrylate. Testing the laminates under the condition of a double-length washout time indicates a minimum main irradiation time of 6 minutes, with other image elements, in particular fine lines and dots, requiring even longer irradiation times.

EXAMPLE 8

8.1 Preparation of base coat

Sheets of 1.05 mm thick aluminum and 0.24 mm thick steel were first coated with a base coat as described under Example 3.1.

8.2 Preparation of intermediate layer

These base-coated metal sheets were coated with a 20% strength solution of a mixture consisting of 49 parts of a carboxyl-containing acrylic resin (acid number 74, molecular weight 30000, $T_G$ 42° C., e.g. Carboset resin XL 44 from BF Goodrich), 49 parts of phenyl glycidyl ether acrylate and 2 parts of benzil dimethyl ketal applied in layered form. The applied coat was flashed off at room temperature for 1 hour and baked at 160° C. for 5 minutes. The dry film thickness of the resulting adhesion-promoting layer was 10 μm.

8.3 Application of light-sensitive relief-forming layer:

A light-sensitive layer consisting of 80 parts of a terpolmer (from 60% ethylene, 20% acrylic acid and 20% n-butyl acrylate, melt flow index about 300), 15 parts of hexanediol diacrylate, 10 parts of N-butylbenzene-sulfonamide, 2 parts of benzil dimethyl ketal and 0.4 part of hydroquinone monomethyl ether is laminated onto the intermediate layer, and the resulting laminate material is stored at room temperature for 3 days.

8.4 Testing of laminated materials

The light-sensitive layer was subjected to imagewise exposure and developed with a 1% strength sodium carbonate solution. It was found that the applied intermediate layer showed excellent adhesion not only to the base coat but also to the photopolymerized relief layer. It was not possible to peel off parts of the relief from the steel base. Both primary and secondary adhesion of the adhesion-promoting layer (=intermediate layer) were greater than the cohesion of the photopolymerized relief layer.

EXAMPLE 9

Example 8 was repeated, except that the carboxyl-containing acrylate resin used in the intermediate layer was replaced by the terpolymer (ethylene/acrylic acid/nbutyl acrylate) described under 8.3. Again it was found that the intermediate layer develops excellent adhesion to the base coat and to the photopolymerized relief layer. In this example too the primary and secondary adhesion proved greater than the cohesion of the relief layer.

We claim:

1. A light-sensitive photopolymerizable laminate material suitable for producing printing plates which on a dimensionally stable base carries at least one intermediate layer and on top thereof a relief-forming lightsensitive layer which consists essentially of a mixture of polymeric binder, at least one ethylenically unsaturated polymerizable compound, photoinitiator and thermal polymerization inhibitor, wherein at least one intermediate layer contains a compound of the general formula (I)

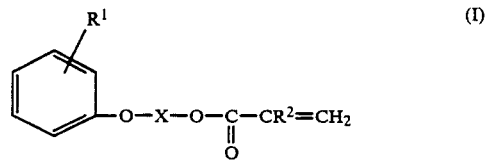

where
$R^1$ is hydrogen or alkyl of from 1 to 10 carbon
$R^2$ is hydrogen or methyl,
and X is

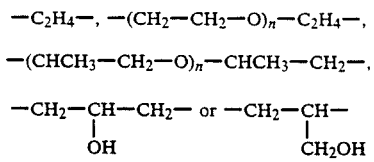

where n is from 1 to 8, in at least partially polymerized state.

2. A laminate as claimed in claim 1, wherein there is present on the dimensionally stable base material as a first intermediate layer a thin layer of a customary adhesion promoter and on top thereof a second intermediate layer which contains a compound of the general formula (I) mixed with a polymeric binder in an at least partially polymerized state.

3. A laminate as claimed in claim 1, wherein at least one intermediate layer consists of a compound of the general formula (I) in an at least partially polymerized state.

4. A laminate as claimed in claim 1, wherein at least one intermediate layer consists of a mixture of a compound of the general formula (I) with a polymeric binder compatible therewith, in which the compound of the general formula (I) is present in an at least partially polymerized state.

5. A laminate as claimed in claim 4, wherein the polymeric binder used is polyvinyl alcohol or a derivative of polyvinyl alcohol.

6. A laminate as claimed in claim 4, wherein the polymeric binder used is a polyamide.

7. A laminate as claimed in claim 4, wherein the binder used is an ethylene/(meth)acrylic ester/(meth)acrylic acid copolymer.

8. A laminate as claimed in claim 1, wherein the relief-forming light-sensitive layer has been covered with a cover sheet removable by peeling.

9. A laminate as claimed in claim 1, wherein in the formula (I) $R^1$ is hydrogen or methyl and X is

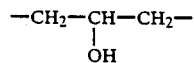

10. A process for producing a light-sensitive photopolymerizable laminate material as claimed in claim 1, which comprises applying a solution which contains a compound of the general formula (I) as an intermediate layer to the dimensionally stable base, substantially removing the solvent, applying the relief-forming light-sensitive layer and then subjecting the layered structure obtained to uniform exposure until the intermediate layer is fully cured without polymerizing the ethylenically unsaturated polymerizable compounds present in the relief-forming layer to any significant extent.

* * * * *

UNITED STATES PATENT AND TRADEMARK OFFICE
CERTIFICATE OF CORRECTION

PATENT NO. : 4,925,769

DATED : May 15, 1990

INVENTOR(S) : Wolfgang HUEMMER, et al

It is certified that error appears in the above-identified patent and that said Letters Patent is hereby corrected as shown below:

Claim 1, column 16, line 19

"1 to 10 carbon" should read --1 to 10 carbon atoms,--

Signed and Sealed this

Ninth Day of July, 1991

Attest:

HARRY F. MANBECK, JR.

Attesting Officer

Commissioner of Patents and Trademarks